(12) United States Patent
Huang et al.

(10) Patent No.: US 10,169,513 B2
(45) Date of Patent: Jan. 1, 2019

(54) METHOD AND SYSTEM FOR DESIGNING FPGA BASED ON HARDWARE REQUIREMENTS DEFINED IN SOURCE CODE

(71) Applicant: Baidu USA LLC, Sunnyvale, CA (US)

(72) Inventors: Davy Huang, Sunnyvale, CA (US); Jia Feng, Sunnyvale, CA (US); Hassan Kianinejad, Sunnyvale, CA (US); Yanyan Zhang, Sunnyvale, CA (US); Manjiang Zhang, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 119 days.

(21) Appl. No.: 15/148,478

(22) Filed: May 6, 2016

(65) Prior Publication Data
US 2017/0323045 A1 Nov. 9, 2017

(51) Int. Cl.
*G06F 17/50* (2006.01)

(52) U.S. Cl.
CPC ................ *G06F 17/5054* (2013.01)

(58) Field of Classification Search
CPC ... G06F 17/5045; G06F 17/5054; G06F 21/76

USPC ............ 716/100, 102–103, 116–117
See application file for complete search history.

(56) References Cited

U.S. PATENT DOCUMENTS

| | | | |
|---|---|---|---|
| 2005/0183055 A1* | 8/2005 | Herrera | G06F 17/5054 716/102 |
| 2016/0314232 A1* | 10/2016 | Larzul | G06F 17/5054 |

* cited by examiner

*Primary Examiner* — Paul Dinh
(74) *Attorney, Agent, or Firm* — Womble Bond Dickinson (US) LLP

(57) ABSTRACT

According to one embodiment, a source code is parsed to identify a first routine to perform a first function and a second routine to perform a second function. A control signaling topology is determined between the first routine and the second routine based on one or more statements associated with the first routine and the second routine defined in the source code. A first logic block is allocated describing a first hardware configuration representing the first function of the first routine. A second logic block is allocated describing a second hardware configuration representing the second function of the second routine. A register-transfer level (RTL) netlist is generated based on the first logic block and the second logic block. The second logic block is to perform the second function dependent upon the first function performed by the first logic block based on the control signaling topology.

30 Claims, 15 Drawing Sheets

```
main ()
{
    control_signal_type  A_done, A_result_valid;

control_signal_type & B_start = A_done;    // B's start is invoked by A's done  —— 304 control_signal_type & B_select = A_result_valid;  // B's functional select is based on A's result —— 305 control_signal_type & C_abort_n = A_result_valid;  // C's abort is invoked by A's invalid result —— 306 control_signal_type & C_checkpoint = A_done;  // C's checkpoint is A's done —— 307 pragma parallel_task non_blocking // pragma to force compiler generating a concurrent non-blocking task ——301
    run_acc_kernelA(..., &A_done, &A_result_valid);

#pragma parallel_task non_blocking  —— 302
    run_acc_kernelB(..., &B_start, &B_select);

#pragma parallel_task non_blocking  —— 303
    run_acc_kernelC(..., &C_checkpoint, &C_abort_n );
}
```

FIG. 3A

```
void run_acc_kernelA(..., control_signal_type * done, control_signal_type * result_valid)
{
    // Operation of Kernel A
    ...
    if (result == OK)
        { (*result_valid = 1; }
    else
        { (*result_valid = 0; }
    *done = 1;
}
```

FIG. 3B

```
void run_acc_kernelB(..., control_signal_type * start, control_signal_type * select)
{
    while (*start == 0) {;}   // wait here till Kernel B can start
    if (*select == 1)
    { // Operation of Kernel B if Kernel A's result is valid
        ...
    }
    else
    { // Operation of Kernel B if Kernel A's result is invalid
        ...
    }
}
```

FIG. 3C

```
void run_acc_kernelC(..., control_signal_type * checkpoint, control_signal_type * abort_n)
{
    #pragma atomic_variable
    int my_abort = 0;    // To tell compiler this is an atomic variable pragma parallel_task non_blocking
    {
        while (*checkpoint == 0) {;}
        my_abort = 1 - *abort_n; // latch abort control signal at the checkpoint
    } pragma parallel_task non_blocking
    {
        while (my_abort == 0)
        {
            // normal operation of Kernel C
            ......
        }
        // Execute abort sequence of Kernel C
        ......
    }
}
```

FIG. 3D

```
pipe int p0 __attribute__ (pipe_depth(512));
pipe int p1 __attribute__ (pipe_depth(512));

void kernelA (... ...)
{
   int i;
   int g[512];

for ( i=0; i<512;i++)
   {
      // Operation of Kernel A on data g[i]
      write_pipe(p0, &g[i]);
   }
} void kernelB (int a)
{
    int g, adder;
    read_pipe (p0, &g);
    adder = g + inc;
    write_pipe (p1, &adder);
} void kernelC (... ...)
{
   int i;
   int t[512];
   for (i=0; i<512; i++)
   {
      read_pipe(p1, &t[i]);
      // Operation of Kernel C on data t[i]
   }
}
```

FIG. 6A
(Prior Art)

```
mem_iface int m0[512];

void kernelA (... ...)
{
   int i;
   int g[512];

for ( i=0; i<512;i++)
   {
      // Operation of Kernel A on data g[i]
   }                                             /-601
      write_mem_iface(&m0[0], &g[0], 512));  // write values from array g to memory
interface m0, for a given length of 512, starting from address 0
} void kernelB (int addr, int inc)
{
      int i, g, adder;          602
      read_mem_iface (&g, &m0[addr], 1);  // read values from memory interface m0,
store it to variable g, for a given length of 1, located at a given address location (random
access)
      adder = g + inc;
      write_mem_iface (&m0[addr], &adder, 1);
} void kernelC (int addr)
{
   int i;
   int t;                        /-603
   read_mem_iface(&t, &m0[addr], 1);
      // Operation of Kernel C on data t
}
```

FIG. 6B

```
main ()
{
    control_signal_type  A_done, A_result_valid;

control_signal_type & B_start = A_done;

control_signal_type & B_select = A_result_valid;

control_signal_type & C_abort_n = A_result_valid;

control_signal_type & C_checkpoint = A_done;

#pragma parallel_task non_blocking
    #pragma device fpga0      // Specify a target device to implement this kernel  ─── 901
    run_acc_kernelA(..., &A_done, &A_result_valid);

#pragma parallel_task non_blocking
    #pragma device fpga1 ─── 902
    run_acc_kernelB(..., &B_start, &B_select);

#pragma parallel_task non_blocking
    #pragma device fpga2 ─── 903
    run_acc_kernelC(..., &C_checkpoint, &C_abort_n );
}
```

FIG. 9

METHOD AND SYSTEM FOR DESIGNING FPGA BASED ON HARDWARE REQUIREMENTS DEFINED IN SOURCE CODE

FIELD OF THE INVENTION

Embodiments of the present invention relate generally to designing a field programmable gate array (FPGA). More particularly, embodiments of the invention relate to designing FPGA based on software-defined hardware requirements.

BACKGROUND

Using field programmable gate array (FPGA) devices as coprocessors to accelerate high-volume data-center applications is already a well-established solution in today's high performance computing (HPC) field. This approach not only can offload significant amount of computation workloads from a central processing unit (CPU) to FPGA and free up CPU for other tasks, but can also achieve better performance thanks to FPGA's high parallelism, high throughput, low power consumption, and low and deterministic latency.

Nowadays the state of the art FPGA design methodology typically uses two types of design flows, both are still very hardware oriented and have a significant problem with a long development cycle, limited scalability and inflexibility. In the first type of design flows, after receiving functional requirements for a software application, FPGA designers come up a hardware design architecture and write in hardware description language (HDL), such as Verilog™ and VHDL, as their design entry to build a FPGA design from a block level to a system level. This method requires a special knowledge of parallel programming and HDL. It requires incredibly detailed design to cover every aspect of hardware circuits. Due to the complexity and a long development cycle of HDL, this method usually isolates the hardware development from software evolvement, hence cannot match the fast pace of software progressing, nor support fast iteration of software optimization. Using this method it also means a significant amount of work is required when porting applications from generation to generation of FPGA technology.

In the second type of design flows, after extracting and identifying some functional blocks in the software application, FPGA designers use a high-level synthesis (HLS) tool to perform some level of code transformation then generate HDL based on the original C/C++ source codes, then plug these HDL blocks into a system-level design using HDL. This method somewhat shortens the HDL development time thanks to HLS's C to a register transfer level (RTL) compilation flow. However, it usually predefines a fixed top-down hardware architecture including fixed data paths, data flows and topology among multiple functional blocks. Such fixed architecture cannot easily nor effectively support Software re-partitioning or data flow rearrangement, because interfaces and interconnects among those functional blocks are still written in HDL. Writing and verifying HDL codes are still time-consuming tasks.

Furthermore, having multiple FPGAs working together to provide a scale-up solution to expand computation capacity and support large scale software routine is also required in a high-performing computing (HPC) system. In both design flows as described above inter-FPGA communication is predefined as part of the hardware architecture instead of a software abstraction. It often requires software/hardware co-design to settle on a fixed architecture. Such created architecture dedicated to certain software application does not provide software developers a flexible and adaptive solution that allows them to iterate different data flows.

BRIEF DESCRIPTION OF THE DRAWINGS

Embodiments of the invention are illustrated by way of example and not limitation in the figures of the accompanying drawings in which like references indicate similar elements.

FIGS. 3A-3D are pseudocodes representing source code with definition of inter-logic block communication topology according to certain embodiments of the invention.

FIG. 6A is pseudocode representing conventional source code having data transfer via a FIFO.

FIG. 6B is pseudocode representing software-defined memory mapped data transfer according to one embodiment of the invention.

FIG. 9 is pseudocode illustrating software-defined splitting of functionalities in designing FPGA according to one embodiment of the invention.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a software-defined FPGA platform is utilized to provide an integral software abstraction environment and a programming model on both computation function and data flow (both intra- and inter-FPGA), and a coupled hardware design that can quickly adapt and map to such an abstraction. The hardware platform may include one or more CPU (host) server nodes are connected via an interconnect bus to one or more FPGA devices (clients). A FPGA design software tool chain is configured to interpret source code that defines at least some of the required hardware resources, communication topology and data flows amongst the hardware components. The FPGA design software tool chain then maps the RTL netlist to a target hardware based on the software defined hardware requirements.

According to one embodiment, the FPGA design tool parses source code to identify a first routine to perform a first function and a second routine to perform a second function. The FPGA design tool determines a control signaling topology between the first routine and the second routine based on one or more statements or definition blocks associated with the first routine and the second routine, which are defined in the source code. The FPGA design tool allocates a first logic block (e.g., kernel block) describing a first hardware configuration representing the first function of the first routine. The FPGA design tool allocates a second logic block (e.g., kernel block) describing a second hardware configuration representing the second function of the second routine. The FPGA design tool generates a register transfer level (RTL) netlist based on the first logic block and the second logic block. The second logic block is to perform the second function dependent upon the first function performed by the first logic block based on the control signaling topology (e.g., wait signal, conditional enabling signal).

Figure 1:
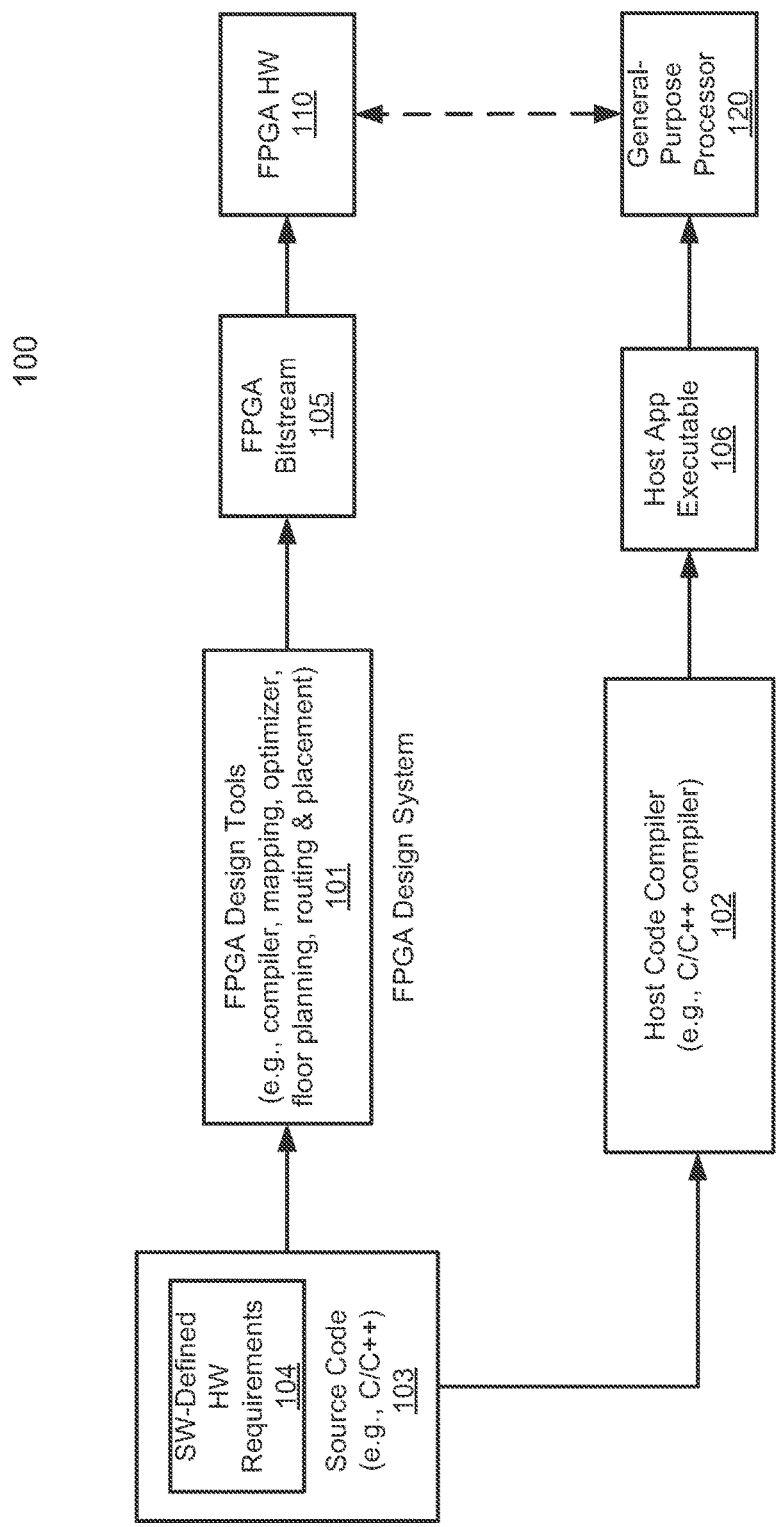
FIG. 1 is a block diagram illustrating a software-defined FPGA design architecture according to one embodiment of the invention.

FIG. 1 is a block diagram illustrating a software-defined FPGA design architecture according to one embodiment of the invention. Referring to FIG. 1, FPGA design tool 101 and host code compiler 102. FPGA design tool 101 may be a chain of FPGA tools to interpret software-defined hardware requirements 104 to generate FPGA bitstream 105, which can be executed in one or more FPGAs 110 to carry out one or more functions designed in source code 103. Source code 103 may be written in a variety of programming languages, such as C/C++, HDL, etc. Host code compiler 102, which may be a C/C++ compiler, is configured to compile host code portion of source code 103 to generate host application executable 106. Host application executable 106 may be executed by one or more general-purpose processors (e.g., CPU), where host application executable 106 invokes or communicates with one or more functions performed by FPGA(s) 110, via a proper communication or signaling topology or protocol defined by source code 103, to perform specific functionalities. Note that source code 103 can be any computer programmable languages as long as the corresponding compiler (e.g., FPGA design tools 101, compiler 102) is able to parse and compile source code 103. General-purpose processor 102 can be a processor, an application specific standard product (ASSP), or any computing device. FPGA hardware 110 can be external to processor 120 or integrated within processor 120.

In one embodiment, a software-defined FPGA platform includes one or more CPU server nodes as a host (e.g., processor 120) coupled to, via an interconnect bus, one or more FPGA devices as a client. The server node(s) and the FPGA(s) may be populated on a PCI Express (PCIe) card, connected to each other via interconnects (e.g. PCIe links). The FPGA devices (e.g., FPGA 110) are dynamically configured with logic blocks (also referred to as acceleration kernels, configurable logic blocks or CLB), which can perform computation on the data stored inside the FPGA, or external to the FPGA (e.g. in a double data rate (DDR) memory). Data are prepared and moved from a system memory on the CPU server to the target FPGA device, via the interconnect protocol (e.g. PCIe link), for example, managed by a direct memory access (DMA) engine. Partially computed data can move from logic block to logic block within an FPGA via internal interconnects, or move from an FPGA device to another FPGA device via external interconnects. Multiple logic blocks can be placed within one FPGA device and among multiple FPGA devices that execute computation routines concurrently and/or sequentially, while those interconnects can form a specified topology to form certain data flow. Multiple FPGAs synchronize and execute mapped software routines inside each logic block, and facilitate data movement between host nodes and client devices, and between FPGA devices.

Referring back to FIG. 1, in one embodiment, FPGA design tool chain 101 interprets source code 103 of software applications, identifies the hardware resource (number of server nodes and FPGA devices) required, and determines necessary topology and data flow through the hardware components. Some of these may be identified and determined based on software defined hardware requirements 104. Based on partitioning between host nodes and client devices, tool chain 101 maps necessary software routines to host nodes and client devices. In one embodiment, the software allocates both host side and client side hardware resources, establishes communication between host nodes and client devices, and establishes an operation sequence and data flow among multiple computation logic blocks implemented inside each FPGAs. Mapping software routines to FPGA devices includes C/C++ to RTL code transformation, as well as constructing interconnects and data flows (manifest as part of the RTL) within each FPGA. Alternatively, the FPGA device can be implemented in a coherent CPU/coprocessor socket, where a coherent bus enables FPGA directly access a system memory on the host side, hence eliminating the need of a PCIe card and PCIe interconnects between the host and the FPGA devices.

Software abstraction of source code 103, for example, as written in C/C++ language, defines data flow topology among multiple functional blocks inside each FPGA, and between multiple FPGAs. Using the provided tool chain 101 FPGA designs can be created from software source code 103 such as C/C++, eliminating the need to write in hardware description language (HDL). Tool chain 101 not only builds each functional blocks inside each FPGA, but also implements interconnects both inside each FPGA (among those functional blocks) and among multiple FPGAs. The built topology is software defined, for example, via definition block(s) 104, so it can be any viable one required by software applications. Tool chain 101 can support several different types of interconnect protocols, including both streaming and memory mapped protocols to meet the demand of different software application. The host code from source code 103 can be compiled by host code compiler (e.g., C/C++ compiler) to generate host application executable 106. Host application executable 106 may be executed by host processor 120. Host application executable 106, when executed by processor 120, can communicate with one or more logic blocks represented by FPGA bitstream 105 of FPGA 110 via an interconnect using a proper protocol that is defined by definition block(s) 104 of source code 103.

Figure 2:
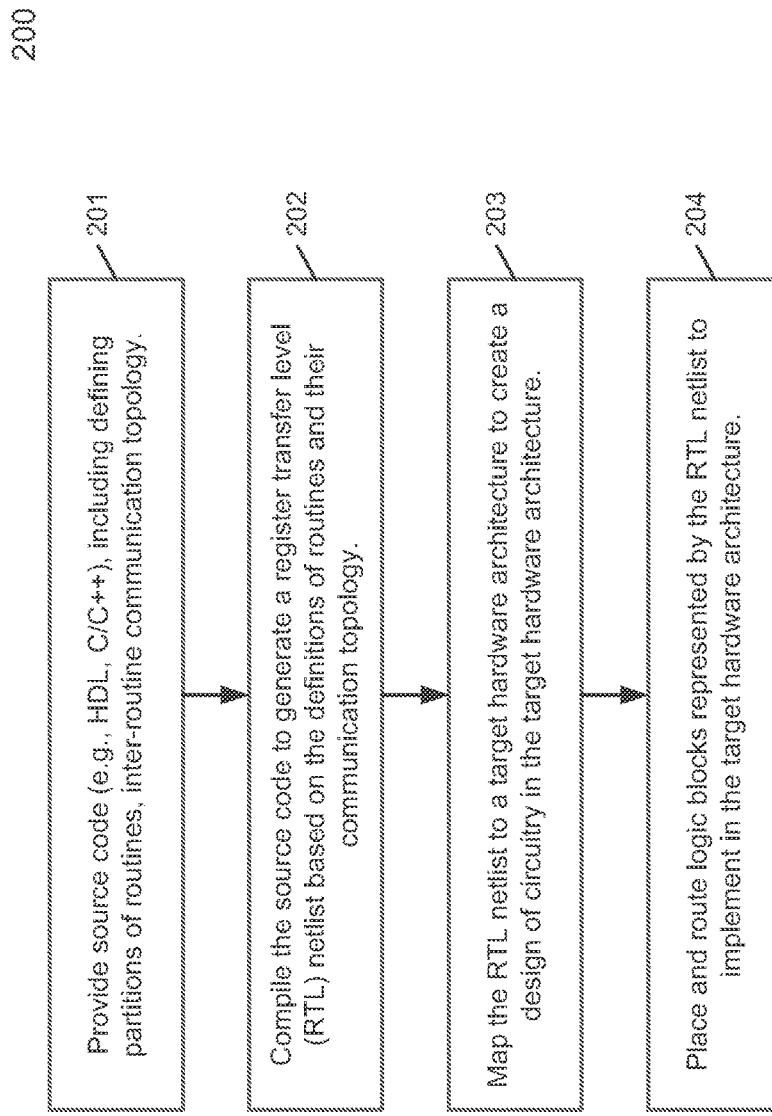
FIG. 2 is a flow diagram illustrating a processing flow of FPGA design based on software defined requirements according to one embodiment of the invention.

FIG. 2 is a flow diagram illustrating a processing flow of FPGA design based on software defined requirements according to one embodiment of the invention. Process 200 may be performed by system 100 of FIG. 1. Referring to FIG. 2, at block 201, source code (e.g., HDL, C/C++) is provided for designing FPGA. The source code includes one or more statements or definition blocks defining partition of routines into multiple FPGA and communication topology amongst logic blocks with a FPGA. At block 202, the source code is compiled to generate an RTL netlist based on the definitions of routines and their communication topology. At block 203, the RTL netlist is mapped to a target hardware architecture to create a design of circuitry in the target hardware architecture. At block 204, logic blocks represented by the RTL netlist are placed and routed in one or more FPGAs, including the proper communication topology defined by the source code.

In general, the architecture of an FPGA based acceleration platform involves a host (CPU) and a device (FPGA). The software running on the host side includes the main software routine where scheduling and management of acceleration commands are embedded. Those commands will typically enqueued then executed by one or more acceleration logic blocks or kernels running on the device. An established PCIe link and its transported data packets facilitate communication between the host and the FPGA device.

The conventional FPGA programming platform, such as OpenCL™, supports event-based synchronization among multiple kernels that involves several function calls. For example, function clEnqueue( ) pushes a command into a queue of execution and returns an event object associated to such a command. More importantly, this function supports a non-blocking use model that can return immediately without waiting for the completion of the command on the target device (e.g., asynchronous operations). Function clGetEventStatus( ) returns a command status for an event, to indicate if such a command is in one of those four states: "In Queue", "Submitted to Device", "Running in the Device", and "Finished execution". Function clWaitForEvents( ) can wait and block any host routine until one or more acceleration commands are completed, indicated by the state of their event objects. Function clEnqueue( ) can accept event wait list(s), so that a command can be scheduled to start after one or more events occurs. Using above functions, an OpenCL™ platform can synchronize the command execution sequence of multiple kernels implemented in a target device.

However, such a platform also has several limitations. There are limited control functions among the kernels within an FPGA. It only enables scheduling of command queues, such as "wait" or "start" actions, similar to a first-in-first-out (FIFO) manner. It cannot handle other fine-grained control signals, such as reset, conditional enable, preemption, flush, and progress feedback signals. A reset signal is to clear previous states in a kernel and restart, instead of continuing its execution based on previous states. A conditional enable signal is to enable partial or selected functions of a kernel. A preemption signal allows a kernel to perform a preempted operation then later resumes its outstanding operation. A flush signal allows a kernel to terminate the current operation, flush any remaining data, and get ready for a next command. A progress feedback signal allows a kernel to provide its execution progress (e.g. how far till completion) to another kernel; such status can be used by the other kernel to adjust its schedule. Although multiple acceleration kernels reside inside the FPGA device, their synchronization are managed by the host side software and implemented using host and device communication via a PCIe link. Such host and device communication has relative long latency contributed by the data transportation time of the PCIe physical media and the data pipeline latency in software stacks in the operating system at the host.

In one embodiment, one of the software defined communication topology or protocol is control signaling protocol between two logic blocks within an FPGA, also referred to as control only signaling protocol or topology. Such communication topology between logic blocks does not involve communications with the host application. In one embodiment, a function of a logic block is conditionally performed based on one or more control signals produced from another logic block. Such dependency of control signaling protocol may be defined within the source code. During a compilation, such definitions are recognized by a compiler and accordingly, the logic blocks are allocated and the control only communication path is allocated between the logic blocks by the tool chain as part of the RTL netlist.

FIGS. 3A-3D are pseudocodes representing source code with definition of inter-logic block communication topology according to certain embodiments of the invention. Referring to FIGS. 3A-3D, a compiler (e.g., tool chain 101 of FIG. 1) can parse and analyze the source code as shown in FIGS. 3A-3D and build corresponding hardware implementation on a target device (e.g., FPGA) that consists of three kernels A, B, and C, and controls signals among these kernels. These control signals are implemented within the FPGA device without the involvement of host side software.

In this example, referring now to FIG. 3A, all three kernels A-C are interpreted by the compiler as concurrent tasks in the FPGA hardware, according to their respective definitions, in this example, pragma specifications 301-303 (e.g., #pragma parallel_task non_blocking). Kernel A drives two control signals: done and result_valid. Kernel B waits until it receives the "start" signal, which corresponds to Kernel A's done signal as defined by line 304, then conditionally enable its operation based on A's result status as defined by line 305. Kernel C concurrently operates with Kernel A, however, constantly checking the event of A's done as its checkpoint as defined by line 307. When the checkpoint occurs, Kernel C may terminate its operation if A's result is invalid as defined by line 306. The pseudocodes of specific functions associated with kernels A to C are shown in FIGS. 3B-3D, respectively.

Figure 4:
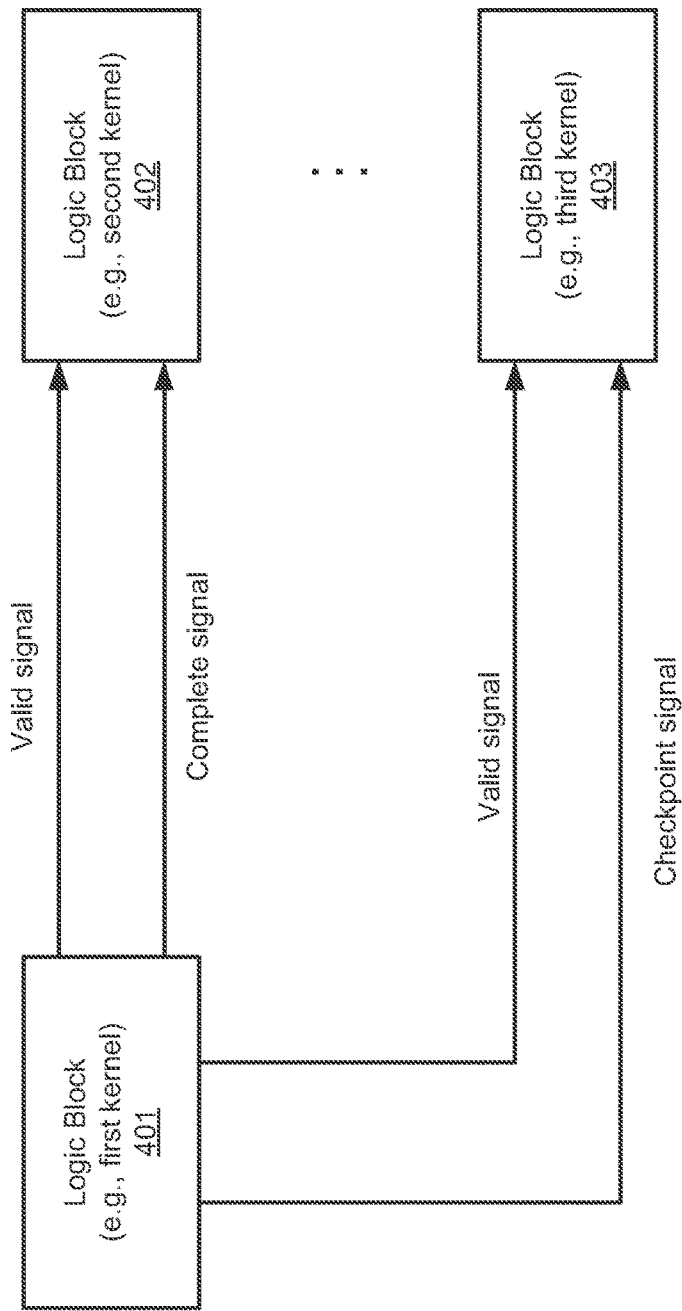
FIG. 4 is a block diagram illustrating an FPGA defined by FIGS. 3A-3D according to one embodiment of the invention.

In summary, this example demonstrates software defined FPGA design that implement hardware control signals including start, wait, conditional enable, and flush. FIG. 4 is a block diagram illustrating an FPGA defined by FIGS. 3A-3D according to one embodiment. Referring to FIG. 4, logic block 401 represents kernel A; logic block 402 represents kernel B; and logic block 403 represents kernel C as described above with respect to FIGS. 3A-3D.

Figure 5:
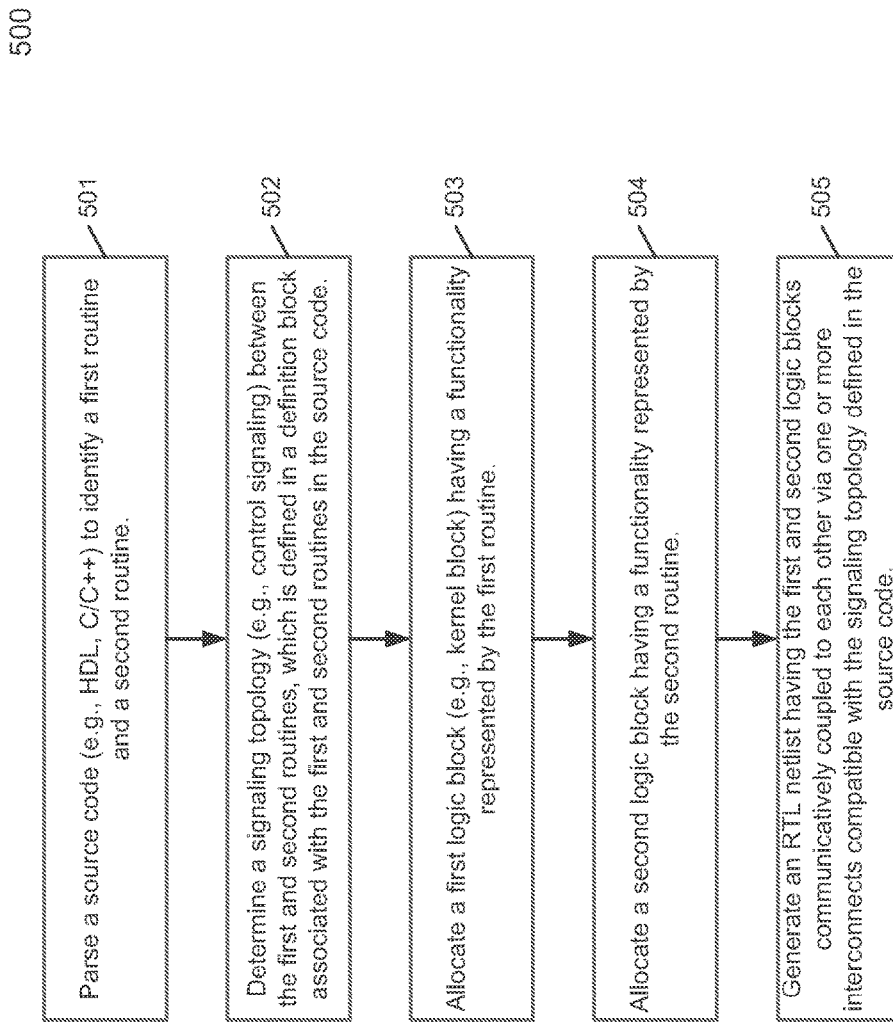
FIG. 5 is a flow diagram illustrating a process of designing FPGA based on software-defined features according to one embodiment of the invention.

FIG. 5 is a flow diagram illustrating a process of designing FPGA based on software-defined features according to one embodiment of the invention. Process 500 may be performed by tool chain 101 of FIG. 1, which may be performed by processing logic in software, hardware, or a combination thereof. Referring to FIG. 5, at block 501, processing logic parses source code (e.g., HDL, C/C++) to identify a first routine and a second routine. At block 502, processing logic determines a signaling topology (e.g., control signaling such as start, wait, conditional enabling, and flush, etc.) between the first routine and the second routine.

The signaling topology is defined in a definition block (e.g., #pragma statements) associated with the first routine and the second routine. At block 503, processing logic allocates a first logic block (e.g., a first kernel) having a functionality represented by the first routine. At block 504, processing logic allocates a second logic block (e.g., a second kernel) represented by the second routine. At block 505, processing logic generates an RTL netlist having the first logic block and the second logic block communicatively coupled to each other via one or more interconnects compatible with the control signaling topology defined in the source code.

As described above, conventional design systems can only support streaming types of data transfer. FIG. 6A is pseudocode representing conventional source code having data transfer via a FIFO mechanism. Referring to FIG. 6A, it uses the concept of "pipe" to enable data streaming between kernels via a FIFO. It is specified with a maximum depth and stores data in a first-in, first-out order. There are two pipes specified in this example code, p0 and p1. Pipe p0 is used to transfer data from kernel A to kernel B, and pipe p0 is used to transfer data from kernel B to kernel C. Each pipe has a depth of 512 values. Functions write_pipe( ) and read_pipe( ) are used to write to and read from the pipes. Such configuration cannot support transferring order other than a first-in-first-out order. For example, it cannot support "first-in, last out" nor random access of the data. It cannot have more than one consumer of the data stream. That is, the data cannot be broadcast to multiple kernels concurrently.

According to one embodiment, the communication topology between two or more logic blocks can be memory mapped data transfer. The data can be transferred in an out of order manner or a multicast manner. Such data transfer can be specified or defined in the source code and interpreted by a compiler. FIG. 6B is pseudocode representing software-defined memory mapped data transfer according to one embodiment of the invention. Referring to FIG. 6B, the pseudocode shows an example of implementing a memory-mapped interface among three kernels A, B, and C. Kernel A generates and stores data into the memory-mapped interface m0 as defined at line 601. Both Kernel B and C read from the interface m0, on a given address, to perform different operations at lines 602 and 603, respectively. Kernel B can even modify the data stored in m0, and write it back. Atomic operation of this shared memory interface is handled by the scheduling function in the software (not shown) and the hardware generated therefrom, to ensure that read at any particular address will not return any half-complete value.

Figure 7:
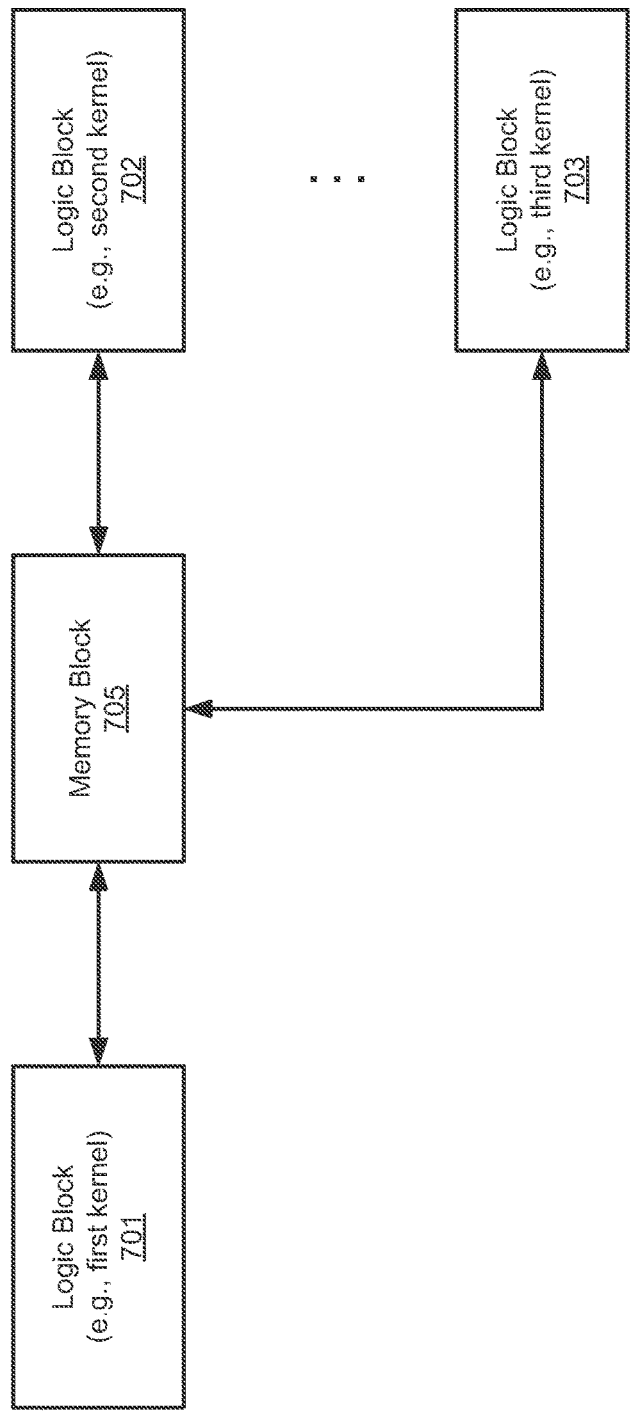
FIG. 7 is a block diagram illustrating an FPGA defined by FIGS. 6A-6B according to one embodiment of the invention.

The compiler parses and interprets the software-define requirements as shown in FIG. 6B and generates an RTL netlist representing the memory-mapped data transfer as shown in FIG. 7. Referring to FIG. 7, logic blocks 701-703 represent kernels A-C respectively. Based on the memory mapped data transfer requirement defined in source code of FIG. 6B, memory block 705 is allocated, as well as the necessary interconnects or ports to allow logic block 701 to write data to memory block 705 and accessible by logic blocks 702-703 in an out of order manner.

On the FPGA, the memory interface of above example can be implemented using on-chip memory of an FPGA device (e.g. a block RAM) with a bus interface such as an AXI interface of the advanced microcontroller bus architecture (AMBA), which contains multiple ports and an arbiter. Each port (assigned to a kernel) supports independent read and write operations. Multiple ports can access the same memory, arbitrated by the AXI arbiter. Using a memory based kernel-to-kernel interface, data movement can be far more flexible than a FIFO based interface, such as one to many data transfer. A single data transfer can occur on any given singular address. A burst transfer can occur when start address and length of transfer are given.

Figure 8:
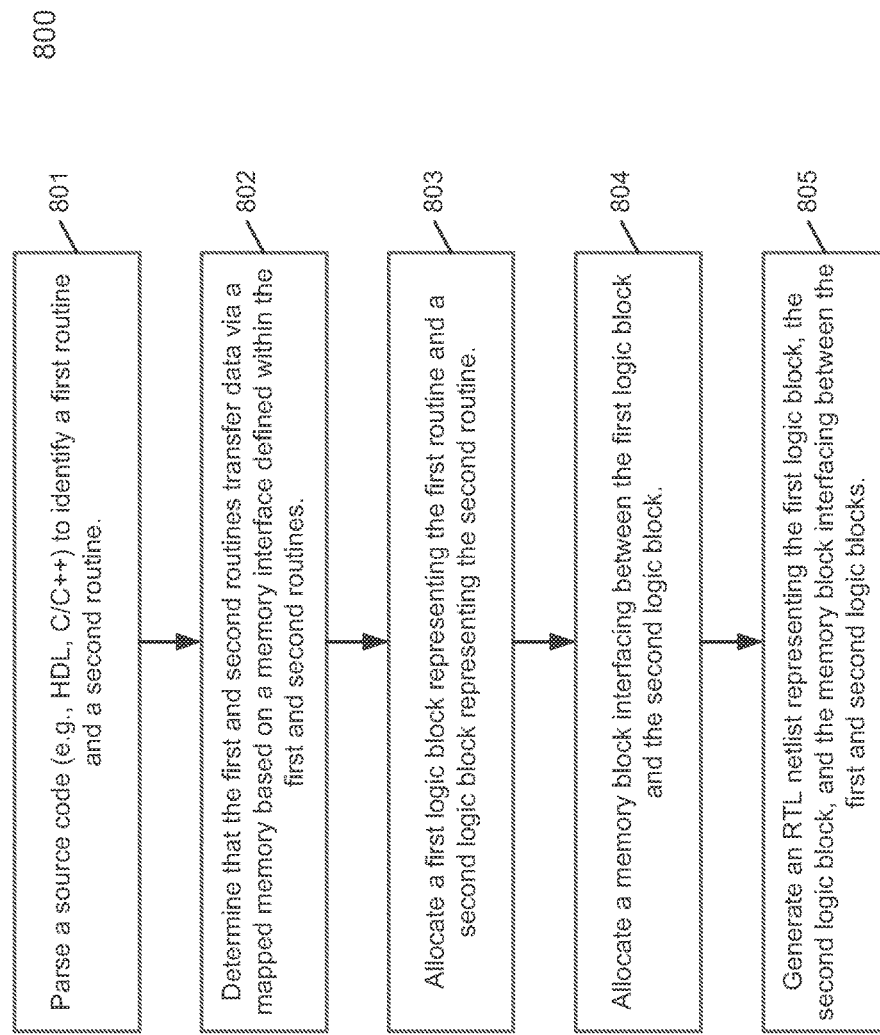
FIG. 8 is a flow diagram illustrating a process of designing FPGA based on software-defined features according to another embodiment of the invention.

FIG. 8 is a flow diagram illustrating a process of designing FPGA based on software-defined features according to another embodiment of the invention. Process 800 may be performed by tool chain 101 of FIG. 1, which may be performed by processing logic in software, hardware, or a combination thereof. Referring to FIG. 8, at block 801, processing logic parses source code (e.g., HDL, C/C++) to identify a first routine and a second routine. At block 802, processing logic determines that the first routine and the second routine transfer data via a mapped memory location based on a memory interface defined within the first routine and the second routine. At block 803, processing logic allocates a first logic block representing the first routine and a second logic block representing the second routine. At block 804, processing logic allocates a memory block interfacing between the first logic block and the second logic block. At block 805, processing logic generates an RTL netlist representing the first logic block, the second logic block, and the memory block between the first and second logic blocks.

According to another embodiment, the software-define techniques can also be utilized to split functionalities of software routines into multiple FPGAs based on the definitions specified in the source code. FIG. 9 is pseudocode illustrating software-defined splitting of functionalities in designing FPGA according to one embodiment of the invention. Referring to FIG. 9, in this example, a user has specified routine run_acc_kernelA to be implemented in fpga0 at line 901. Similarly, routines run_acc_kernelB and run_acc_kernelC are specified to be implemented in fpga1 and fpga2 at lines 902-903, respectively. The compiler parses and recognizes such definitions and will allocate the routines into separate FPGAs.

Figure 10:
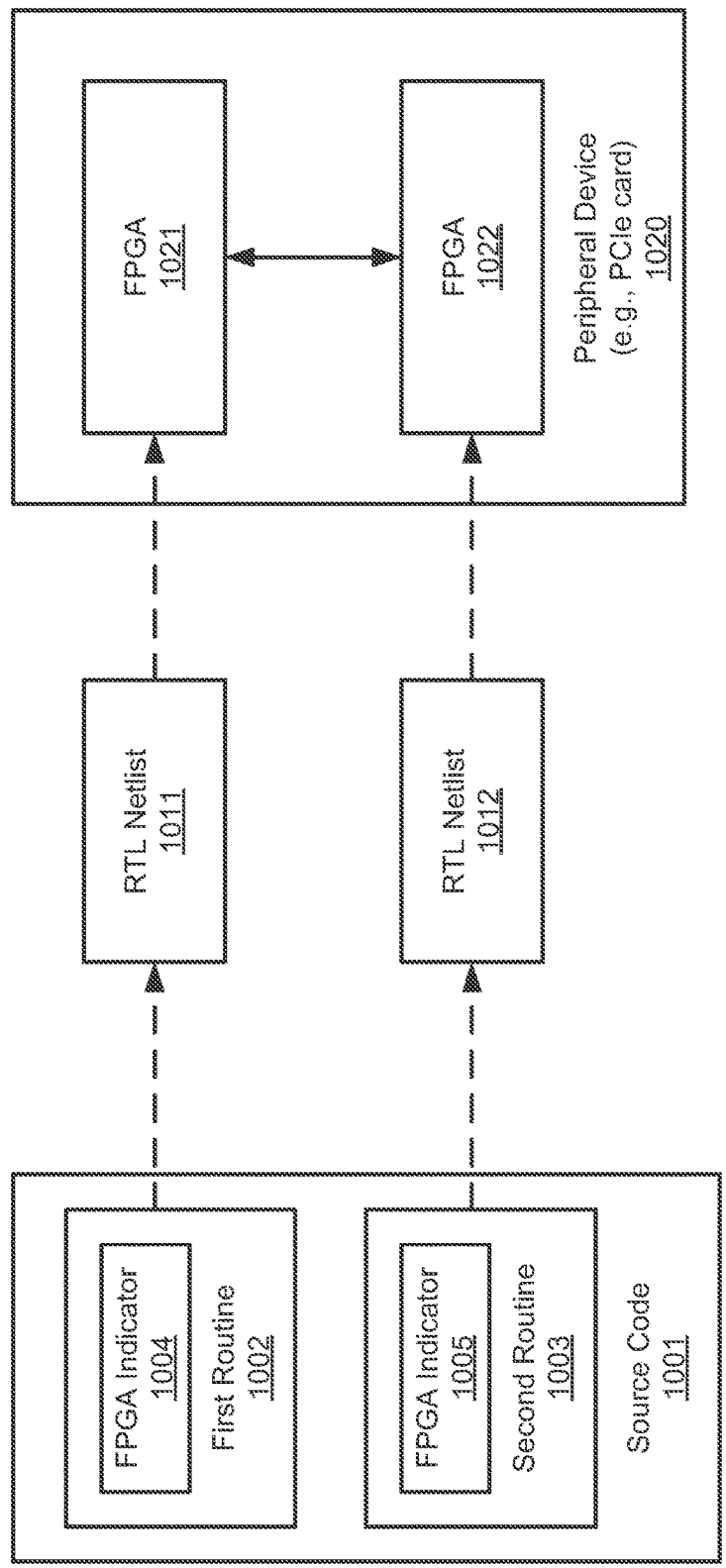
FIG. 10 is a block diagram illustrating an example of software-defined splitting of FPGAs according one embodiment of the invention.

FIG. 10 is a block diagram illustrating an example of software-defined splitting of FPGAs according one embodiment of the invention. Referring to FIG. 10, in this example, source code 1001 includes first routine 1002 and second routine 1003. First routine 1002 includes or is associated with FPGA indicator 1004 indicating that the circuitry represented by first routine 1002 should be implemented in a first FPGA. Similarly, second routine 1003 includes or is associated with FPGA indicator 1005 indicating that the circuitry represented by second routine 1003 should be implemented in a second FPGA. When a compiler parses and compiles source code 1001, it recognizes FPGA indicators 1004-1005. In response RTL netlists 1011-1012 are generates for routines 1002-1003, respectively. RTL netlists 1011-1012 are then converted into bitstreams to be implemented in FPGAs 1021-1022 of peripheral device 1020.

The inter-kernel interfaces described above may be transformed into inter-FPGA interfaces. The impact to the increased latency are analyzed and reported by the compiler. Users can refine and optimize the system architecture based on the report. Alternatively, if enabled, the compiler can estimate the total resources used by each kernel. If the resources exceed a predetermined limit of one FPGA device, it automatically assigns a new FPGA device and convert one or more inter-kernel interfaces to inter-FPGA interfaces. The communication protocol, physical circuit on the printed circuit board (PCB) and characteristic (such as maximum bandwidth and shortest latency) of the inter-FPGA communication channel may be predefined. However, the enabling and utilizing of such channel inside an FPGA can be defined by the software and interpreted by the compiler.

In the example as shown in FIG. 9, it shows that using "pragma device . . . " can explicitly allocate a new FPGA device and its inter-FPGA communication channel(s). As explained above, the compiler can also optionally automatically allocate FPGA devices based on the resource utilization of each kernel, in addition to user-defined requirements. The software code and the compiler can specify the number of FPGA devices, the choice of different types of inter-kernel and inter-FPGA communication channels, the number of DDR channels, and build a customized hardware implementation to match the software definition or user's intention.

Figure 11:
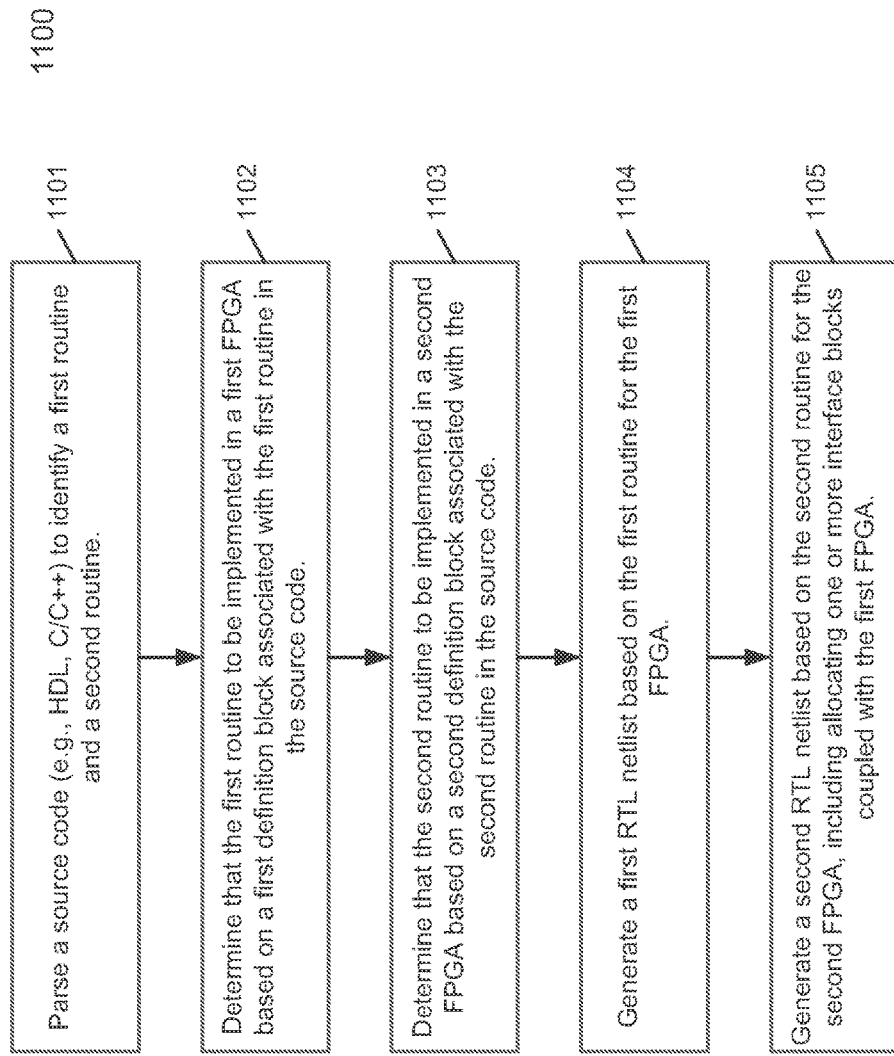
FIG. 11 is a flow diagram illustrating a process for designing FPGA based on software-defined requirements according to another embodiment of the invention.

FIG. 11 is a flow diagram illustrating a process for designing FPGA based on software-defined requirements according to another embodiment of the invention. Process 1100 may be performed by tool chain 101 of FIG. 1, which may be performed by processing logic in software, hardware, or a combination thereof. Referring to FIG. 11, at block 1101, processing logic parses source code (e.g., HDL, C/C++) to identify a first routine and a second routine. At block 1102, processing logic determines that the first routine to be implemented in a first FPGA based on a first definition block associated with the first routine in the source code. At block 1103, processing logic determines that the second routine to be implemented in a second FPGA based on a second definition block associated with the second routine in the source code. At block 1104, processing logic generates a first RTL netlist for the first FPGA based on the first routine. At block 1105, the processing logic generates a second RTL netlist for the second FPGA based on the second routine, including allocating one or more interface blocks coupled with the first FPGA.

Figure 12:
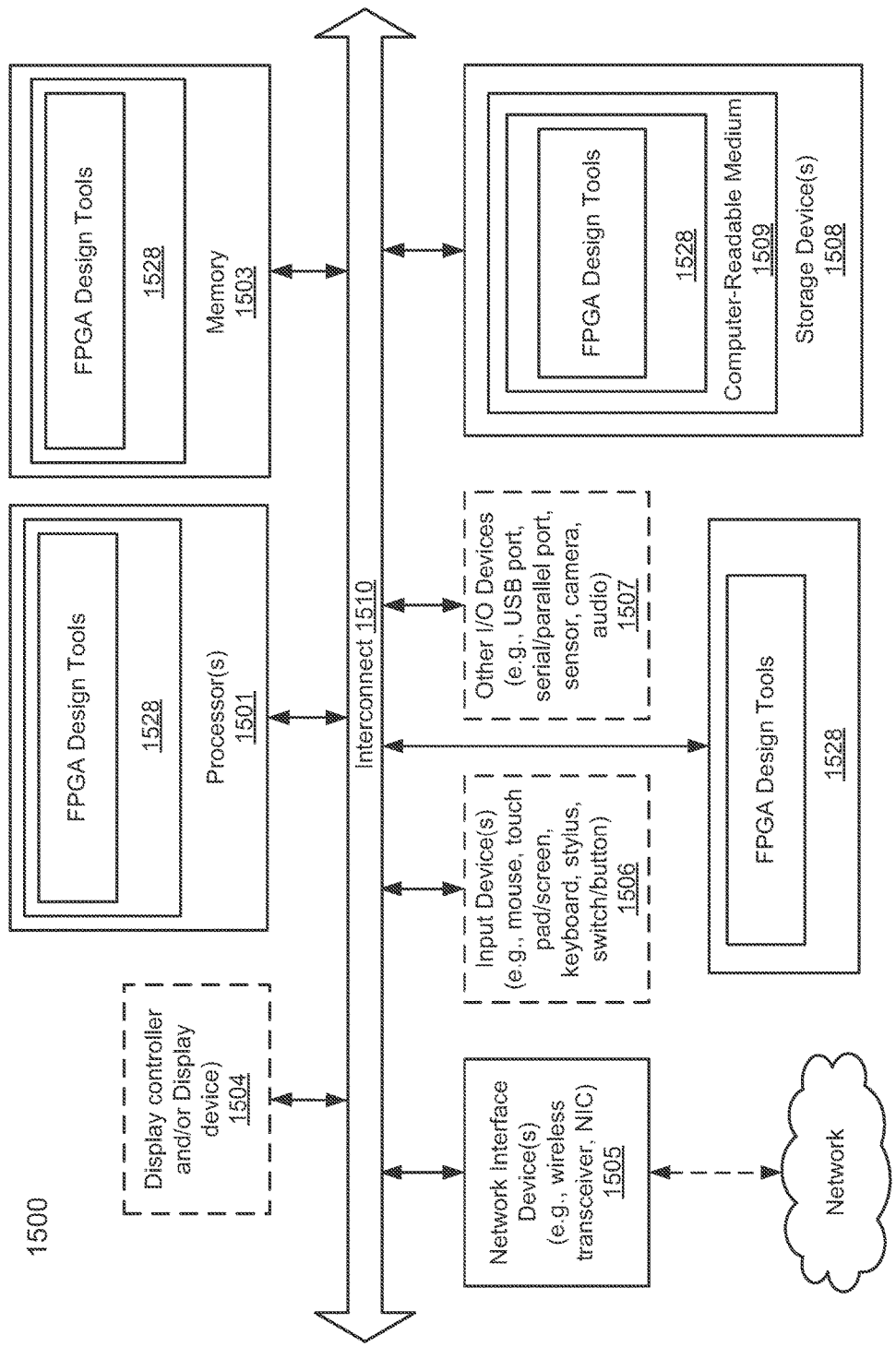
FIG. 12 is a block diagram illustrating a data processing system according to one embodiment.

FIG. 12 is a block diagram illustrating an example of a data processing system which may be used with one embodiment of the invention. For example, system 1500 may represent any of data processing systems described above performing any of the processes or methods described above, such as, for example, system 100 of FIG. 1, as described above. System 1500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system.

Note also that system 1500 is intended to show a high level view of many components of the computer system. However, it is to be understood that additional components may be present in certain implementations and furthermore, different arrangement of the components shown may occur in other implementations. System 1500 may represent a desktop, a laptop, a tablet, a server, a mobile phone, a media player, a personal digital assistant (PDA), a Smartwatch, a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 1500 includes processor 1501, memory 1503, and devices 1505-1508 via a bus or an interconnect 1510. Processor 1501 may represent a single processor or multiple processors with a single processor core or multiple processor cores included therein. Processor 1501 may represent one or more general-purpose processors such as a microprocessor, a central processing unit (CPU), or the like. More particularly, processor 1501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 1501 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 1501, which may be a low power multi-core processor socket such as an ultra-low voltage processor, may act as a main processing unit and central hub for communication with the various components of the system. Such processor can be implemented as a system on chip (SoC). Processor 1501 is configured to execute instructions for performing the operations and steps discussed herein. System 1500 may further include a graphics interface that communicates with optional graphics subsystem 1504, which may include a display controller, a graphics processor, and/or a display device.

Processor 1501 may communicate with memory 1503, which in one embodiment can be implemented via multiple memory devices to provide for a given amount of system memory. Memory 1503 may include one or more volatile storage (or memory) devices such as random access memory (RAM), dynamic RAM (DRAM), synchronous DRAM (SDRAM), static RAM (SRAM), or other types of storage devices. Memory 1503 may store information including sequences of instructions that are executed by processor 1501, or any other device. For example, executable code and/or data of a variety of operating systems, device drivers, firmware (e.g., input output basic system or BIOS), and/or applications can be loaded in memory 1503 and executed by processor 1501. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 1500 may further include IO devices such as devices 1505-1508, including network interface device(s) 1505, optional input device(s) 1506, and other optional IO device(s) 1507. Network interface device 1505 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 1506 may include a mouse, a touch pad, a touch sensitive screen (which may be integrated with display device 1504), a pointer device such as a stylus, and/or a keyboard (e.g., physical keyboard or a virtual keyboard displayed as part of a touch sensitive screen). For example, input device 1506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 1507 may include an audio device. An audio device may include a speaker and/or a microphone to facilitate voice-enabled functions, such as voice recognition, voice replication, digital recording, and/or telephony functions. Other IO devices 1507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. Devices 1507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 1510 via a sensor hub (not shown), while other devices such as a keyboard or thermal sensor may be controlled by an embedded controller (not shown), dependent upon the specific configuration or design of system 1500.

To provide for persistent storage of information such as data, applications, one or more operating systems and so forth, a mass storage (not shown) may also couple to processor 1501. In various embodiments, to enable a thinner and lighter system design as well as to improve system responsiveness, this mass storage may be implemented via a solid state device (SSD). However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 1501, e.g., via a serial peripheral interface (SPI). This flash device may provide for non-volatile storage of system software, including a basic input/output software (BIOS) as well as other firmware of the system.

Storage device 1508 may include computer-accessible storage medium 1509 (also known as a machine-readable storage medium or a computer-readable medium) on which is stored one or more sets of instructions or software (e.g., module, unit, and/or logic 1528) embodying any one or more of the methodologies or functions described herein. Module/unit/logic 1528 may represent any of the components described above, such as, for example, a search engine, an encoder, an interaction logging module as described above. Module/unit/logic 1528 may also reside, completely or at least partially, within memory 1503 and/or within processor 1501 during execution thereof by data processing system 1500, memory 1503 and processor 1501 also constituting machine-accessible storage media. Module/unit/logic 1528 may further be transmitted or received over a network via network interface device 1505.

Computer-readable storage medium 1509 may also be used to store the some software functionalities described above persistently. While computer-readable storage medium 1509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Module/unit/logic 1528, components and other features described herein can be implemented as discrete hardware components or integrated in the functionality of hardware components such as ASICS, FPGAs, DSPs or similar devices. In addition, module/unit/logic 1528 can be implemented as firmware or functional circuitry within hardware devices. Further, module/unit/logic 1528 can be implemented in any combination hardware devices and software components.

Note that while system 1500 is illustrated with various components of a data processing system, it is not intended to represent any particular architecture or manner of interconnecting the components; as such details are not germane to embodiments of the present invention. It will also be appreciated that network computers, handheld computers, mobile phones, servers, and/or other data processing systems which have fewer components or perhaps more components may also be used with embodiments of the invention.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The techniques shown in the figures can be implemented using code and data stored and executed on one or more electronic devices. Such electronic devices store and communicate (internally and/or with other electronic devices over a network) code and data using computer-readable media, such as non-transitory computer-readable storage media (e.g., magnetic disks; optical disks; random access memory; read only memory; flash memory devices; phase-change memory) and transitory computer-readable transmission media (e.g., electrical, optical, acoustical or other form of propagated signals—such as carrier waves, infrared signals, digital signals).

The processes or methods depicted in the preceding figures may be performed by processing logic that comprises hardware (e.g. circuitry, dedicated logic, etc.), firmware, software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A computer-implemented method for programming a field programmable gate array (FPGA), the method comprising:
   parsing, by a compiler executed by a processor, a source code to identify a first routine to perform a first function and a second routine to perform a second function;
   determining, by the compiler, a control signaling topology between the first routine and the second routine based on one or more statements associated with the first routine and the second routine defined in the source code;
   allocating, by the compiler, a first logic block describing a first hardware configuration representing the first function of the first routine;
   allocating, by the compiler, a second logic block describing a second hardware configuration representing the second function of the second routine; and
   generating, by the compiler, a register-transfer level (RTL) netlist based on the first logic block and the second logic block, wherein the second logic block is to perform the second function dependent upon the first function performed by the first logic block based on the control signaling topology, wherein the RTL netlist is provided for subsequent design and manufacturing the FPGA.

2. The method of claim 1, wherein the control signaling topology specifies that the second function is not performed until the first function is completed, without signaling with a host processor external to the FPGA.

3. The method of claim 2, wherein the control signaling topology specifies that the second function is performed only if a result of the first function satisfies a predetermined condition.

4. The method of claim 1, wherein the source code includes a first statement specifying that the first routine is a non-blocking routine, and wherein the source code further includes a second statement specifying that the second routine is a non-blocking routine, such that the first routine and the second routine are executed asynchronously.

5. The method of claim 1, further comprising:
   determining that the first routine transfers data to the second routine via a memory location based on an application programming interface (API) specified in the source code; and
   allocating a memory block between the first logic block and the second logic block to allow the first logic block writes data to the memory block and the second logic block to read data from the memory block.

6. The method of claim 5, wherein the memory block provides a memory mapped storage location to store the data accessible by the first logic block and the second logic block asynchronously.

7. The method of claim 6, wherein the memory block is accessible by a third logic block to perform a third function based on data stored in the memory block produced by the first logic block.

8. The method of claim 6, wherein the second logic block writes second data to the memory block.

9. The method of claim 1, further comprising:
   determining based on a first statement associated with the first routine in the source code that the first routine is to be implemented in a first FPGA;
   determining based on a second statement associated with the second routine in the source code that the second routine is to be implemented in a second FPGA;
   generating a first RTL netlist for the first routine to be programmed in the first FPGA; and
   generating a second RTL netlist for the second routine to be programmed in the second FPGA.

10. The method of claim 9, wherein the first RTL netlist includes instructions describing a first interface circuit interfacing with the second FPGA, and wherein the second RTL netlist includes instructions describing a second interface circuit interfacing with the first FPGA.

11. A non-transitory machine-readable medium having instructions stored therein, which when executed by a processor, cause the processor to perform operations of designing a field programmable gate array (FPGA), the operations comprising:
   parsing a source code to identify a first routine to perform a first function and a second routine to perform a second function;
   determining a control signaling topology between the first routine and the second routine based on one or more statements associated with the first routine and the second routine defined in the source code;
   allocating a first logic block describing a first hardware configuration representing the first function of the first routine;
   allocating a second logic block describing a second hardware configuration representing the second function of the second routine; and
   generating a register-transfer level (RTL) netlist based on the first logic block and the second logic block, wherein the second logic block is to perform the second function dependent upon the first function performed by the first logic block based on the control signaling topology, wherein the RTL netlist is provided for subsequent design and manufacturing the FPGA.

12. The non-transitory machine-readable medium of claim 11, wherein the control signaling topology specifies that the second function is not performed until the first function is completed, without signaling with a host processor external to the FPGA.

13. The non-transitory machine-readable medium of claim 12, wherein the control signaling topology specifies that the second function is performed only if a result of the first function satisfies a predetermined condition.

14. The non-transitory machine-readable medium of claim 11, wherein the source code includes a first statement specifying that the first routine is a non-blocking routine, and wherein the source code further includes a second statement specifying that the second routine is a non-blocking routine, such that the first routine and the second routine are executed asynchronously.

15. The non-transitory machine-readable medium of claim 11, wherein the operations further comprise:

determining that the first routine transfers data to the second routine via a memory location based on an application programming interface (API) specified in the source code; and allocating a memory block between the first logic block and the second logic block to allow the first logic block writes data to the memory block and the second logic block to read data from the memory block.

16. The non-transitory machine-readable medium of claim 15, wherein the memory block provides a memory mapped storage location to store the data accessible by the first logic block and the second logic block asynchronously.

17. The non-transitory machine-readable medium of claim 16, wherein the memory block is accessible by a third logic block to perform a third function based on data stored in the memory block produced by the first logic block.

18. The non-transitory machine-readable medium of claim 16, wherein the second logic block writes second data to the memory block.

19. The non-transitory machine-readable medium of claim 11, wherein the operations further comprise:
determining based on a first statement associated with the first routine in the source code that the first routine is to be implemented in a first FPGA;
determining based on a second statement associated with the second routine in the source code that the second routine is to be implemented in a second FPGA;
generating a first RTL netlist for the first routine to be programmed in the first FPGA; and
generating a second RTL netlist for the second routine to be programmed in the second FPGA.

20. The non-transitory machine-readable medium of claim 19, wherein the first RTL netlist includes instructions describing a first interface circuit interfacing with the second FPGA, and wherein the second RTL netlist includes instructions describing a second interface circuit interfacing with the first FPGA.

21. A data processing system for searching images for mobile devices, the system comprising:
a processor;
a memory coupled to the processor; and
a compiler loaded in the memory and executed by the processor to perform operations of programming a field programmable gate array (FPGA), the operations including
parsing a source code to identify a first routine to perform a first function and a second routine to perform a second function,
determining a control signaling topology between the first routine and the second routine based on one or more statements associated with the first routine and the second routine defined in the source code,
allocating a first logic block describing a first hardware configuration representing the first function of the first routine,
allocating a second logic block describing a second hardware configuration representing the second function of the second routine, and
generating a register-transfer level (RTL) netlist based on the first logic block and the second logic block, wherein the second logic block is to perform the second function dependent upon the first function performed by the first logic block based on the control signaling topology, wherein the RTL netlist is provided for subsequent design and manufacturing the FPGA.

22. The system of claim 21, wherein the control signaling topology specifies that the second function is not performed until the first function is completed, without signaling with a host processor external to the FPGA.

23. The system of claim 22, wherein the control signaling topology specifies that the second function is performed only if a result of the first function satisfies a predetermined condition.

24. The system of claim 21, wherein the source code includes a first statement specifying that the first routine is a non-blocking routine, and wherein the source code further includes a second statement specifying that the second routine is a non-blocking routine, such that the first routine and the second routine are executed asynchronously.

25. The system of claim 21, wherein the operations further comprise:
determining that the first routine transfers data to the second routine via a memory location based on an application programming interface (API) specified in the source code; and
allocating a memory block between the first logic block and the second logic block to allow the first logic block writes data to the memory block and the second logic block to read data from the memory block.

26. The system of claim 25, wherein the memory block provides a memory mapped storage location to store the data accessible by the first logic block and the second logic block asynchronously.

27. The system of claim 26, wherein the memory block is accessible by a third logic block to perform a third function based on data stored in the memory block produced by the first logic block.

28. The system of claim 26, wherein the second logic block writes second data to the memory block.

29. The system of claim 21, wherein the operations further comprise:
determining based on a first statement associated with the first routine in the source code that the first routine is to be implemented in a first FPGA;
determining based on a second statement associated with the second routine in the source code that the second routine is to be implemented in a second FPGA;
generating a first RTL netlist for the first routine to be programmed in the first FPGA; and
generating a second RTL netlist for the second routine to be programmed in the second FPGA.

30. The system of claim 29, wherein the first RTL netlist includes instructions describing a first interface circuit interfacing with the second FPGA, and wherein the second RTL netlist includes instructions describing a second interface circuit interfacing with the first FPGA.

* * * * *